United States Patent
Kitajima

(10) Patent No.: US 11,424,768 B2
(45) Date of Patent: Aug. 23, 2022

(54) RADIO FREQUENCY MODULE AND COMMUNICATION DEVICE

(71) Applicant: MURATA MANUFACTURING CO., LTD., Nagaokakyo (JP)

(72) Inventor: Hiromichi Kitajima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 16 days.

(21) Appl. No.: 17/123,109

(22) Filed: Dec. 16, 2020

(65) Prior Publication Data
US 2021/0203365 A1    Jul. 1, 2021

(30) Foreign Application Priority Data
Dec. 26, 2019    (JP) .............................. JP2019-237093

(51) Int. Cl.
H04B 1/38      (2015.01)
H04L 5/16      (2006.01)
H04B 1/00      (2006.01)
H03F 3/189     (2006.01)
H04B 1/16      (2006.01)

(52) U.S. Cl.
CPC ............. *H04B 1/006* (2013.01); *H03F 3/189* (2013.01); *H04B 1/0078* (2013.01); *H04B 1/1607* (2013.01); *H03F 2200/294* (2013.01); *H03F 2200/451* (2013.01)

(58) Field of Classification Search
CPC .... H04B 1/006; H04B 1/0078; H04B 1/1607; H03F 3/189; H03F 2200/451; H03F 2200/294; H01L 21/565; H03H 9/02984
USPC ................ 375/219, 220, 222, 350, 295, 316
See application file for complete search history.

(56) References Cited

U.S. PATENT DOCUMENTS 6,538,359 B1 *    3/2003   Hiraku ............... H03H 9/02984
                                                310/313 R
2011/0037170 A1 *  2/2011  Shinohara ............ H01L 21/565
                                                   257/737

FOREIGN PATENT DOCUMENTS

JP    2011-40602 A    2/2011

* cited by examiner

*Primary Examiner* — Phuong Phu
(74) *Attorney, Agent, or Firm* — Xsensus LLP

(57) ABSTRACT

A radio frequency module includes: a module board that includes a first principal surface and a second principal surface on opposite sides of the module board; a power amplifier disposed on the module board; a low noise amplifier disposed on the module board; a transmission filter (a first acoustic wave filter) disposed on one of the first principal surface and the second principal surface; and a reception filter (a second acoustic wave filter) disposed on one of the first principal surface and the second principal surface. An absolute value of a temperature coefficient of frequency (TCF) of the transmission filter is smaller than an absolute value of a TCF of the reception filter, and a distance between the transmission filter and the power amplifier is shorter than a distance between the reception filter and the power amplifier.

19 Claims, 8 Drawing Sheets

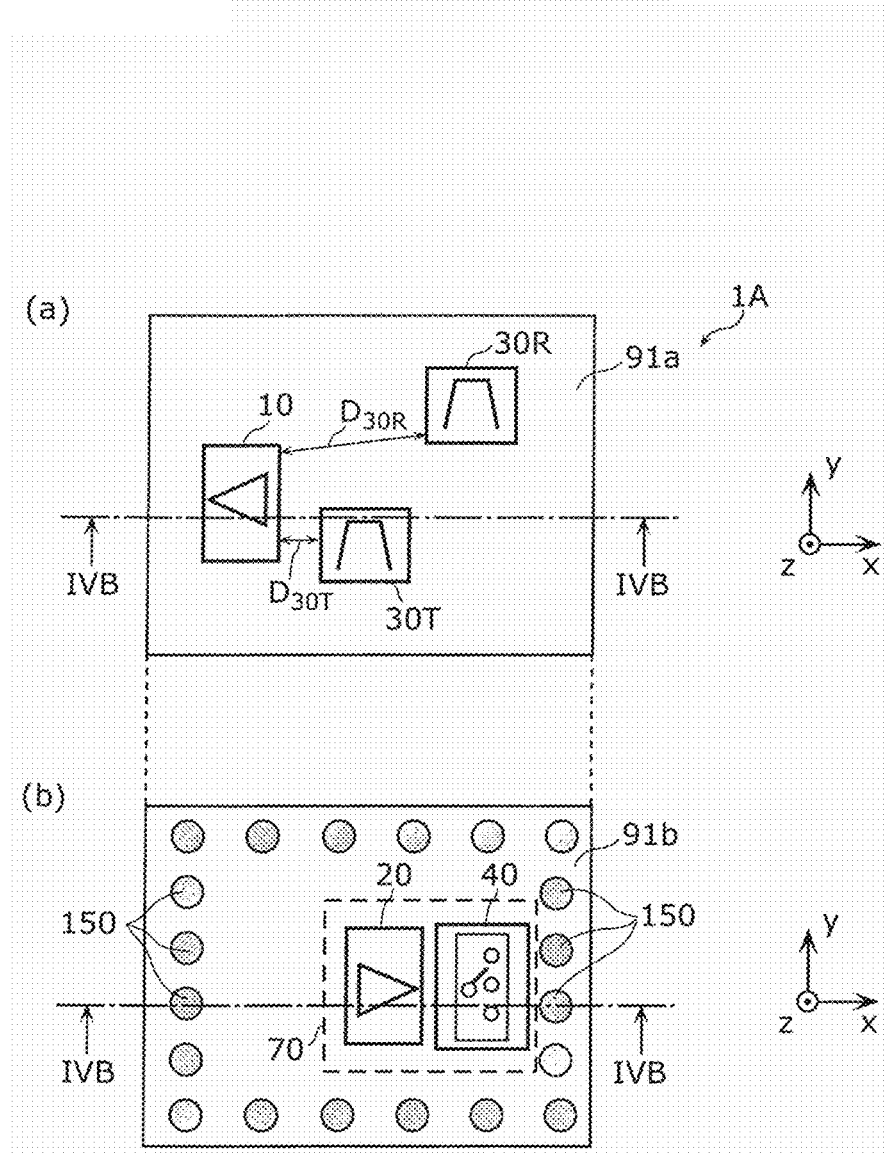

RADIO FREQUENCY MODULE AND COMMUNICATION DEVICE

CROSS REFERENCE TO RELATED APPLICATION

The present application is based on and claims priority of Japanese Patent Application No. 2019-237093 filed on Dec. 26, 2019. The entire disclosure of the above-identified application, including the specification, drawings and claims is incorporated herein by reference in its entirety.

TECHNICAL FIELD

The present disclosure relates to a radio frequency (RF) module and a communication device.

BACKGROUND

In mobile communication apparatuses such as mobile phones, the arrangement of circuit elements included in radio frequency front-end circuits has been made complicated along with the development in multiband technology, in particular.

Japanese Unexamined Patent Application Publication No. 2011-40602 discloses a semiconductor module having a configuration in which out of two element-mountable surfaces of a wiring board, a filter is mounted on the upper surface, and a power amplifier and a low noise amplifier are mounted on the lower surface. For example, a surface acoustic wave filter is used as a filter disposed on the wiring board.

SUMMARY

Technical Problems

However, as recognized by the present inventor, in the semiconductor module disclosed in Japanese Unexamined Patent Application Publication No. 2011-40602, if a surface acoustic wave filter, for example, is used as a filter, passing characteristics of the surface acoustic wave filter exhibit a temperature-dependent frequency change (have frequency-temperature characteristics). A power amplifier that generates a great amount of heat is disposed on the semiconductor module, and thus the temperature of the semiconductor module locally changes. There are cases where passing characteristics of the filter having frequency-temperature characteristics change due to such a temperature change of the semiconductor module, resulting in deterioration of signal-transfer characteristics of the semiconductor module.

The present disclosure has been conceived to solve the above-identified and other problems, and provides a radio frequency module and a communication device that reduce deterioration of signal-transfer characteristics caused by a temperature change.

Solutions

In order to provide such a radio frequency module, a radio frequency module according to an aspect of the present disclosure includes: a module board that includes a first principal surface and a second principal surface on opposite sides of the module board; a power amplifier disposed on the module board; a low noise amplifier disposed on the module board; a transmission filter (a first acoustic wave filter) disposed on one of the first principal surface and the second principal surface; and a reception filter (a second acoustic wave filter) disposed on one of the first principal surface and the second principal surface. An absolute value of a temperature coefficient of frequency (TCF) of the transmission filter is smaller than an absolute value of a TCF of the reception filter, and a distance between the transmission filter and the power amplifier is shorter than a distance between the reception filter and the power amplifier.

Advantageous Effects

According to the present disclosure, a radio frequency module and a communication device that reduce deterioration of signal-transfer characteristics caused by a temperature change is provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 4A is a schematic diagram illustrating a planar configuration of a radio frequency module according to Example 1.

DESCRIPTION OF EMBODIMENTS

Figure 1:
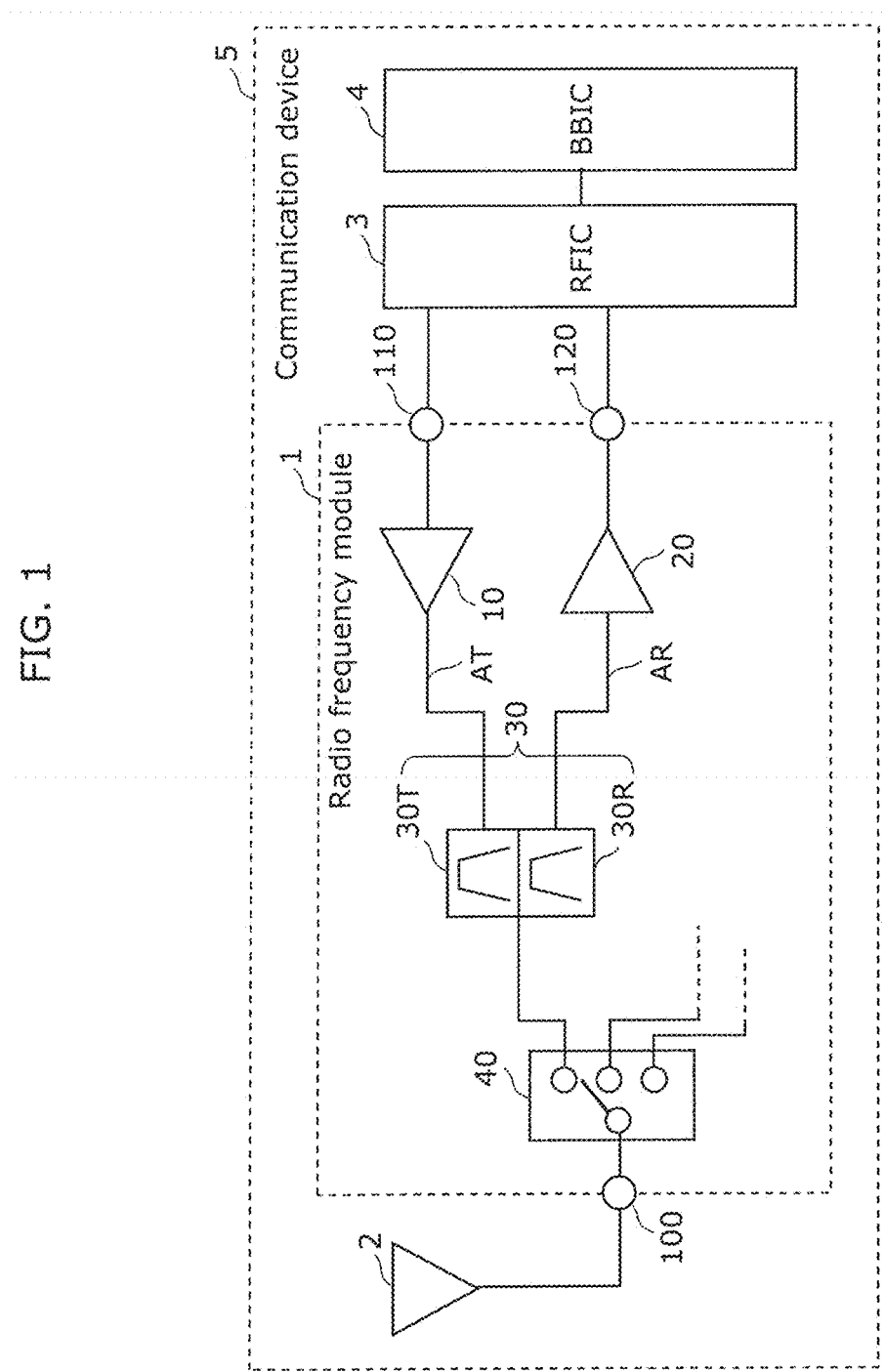
FIG. 1 illustrates a circuit configuration of a radio frequency module (or RF front-end circuitry) and a communication device according to an embodiment.

The following describes in detail embodiments of the present disclosure. Note that the embodiments described below each show a general or specific example. The numerical values, shapes, materials, elements, and the arrangement and connection of the elements, for instance, described in the following embodiments and variations thereof are examples, and thus are not intended to limit the present disclosure. Among the elements in the following embodiments and variations thereof, elements not recited in any of the independent claims are described as optional elements. In addition, the sizes of elements and the ratios of the sizes illustrated in the drawings are not necessarily accurate. Throughout the drawings, the same numeral is given to substantially the same element, and redundant description is omitted or simplified.

In the following, a term that indicates a relation between elements such as "parallel" or "perpendicular", a term that indicates the shape of an element such as "rectangular", and a numerical range do not necessarily have only strict meanings, but also have substantially equivalent meanings that include a difference of about several percent, for example.

In the following, regarding object A and object B that are disposed on a board, a "distance between A and B" means the shortest distance between A and B. Stated differently, the "distance between A and B" is the length of the shortest line segment out of a plurality of line segments that connect the outer edge of object A and the outer edge of object B.

In the following, a "transmission path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode.

In the following, "A and B are connected" applies not only when A and B are physically connected, but also when A and B are electrically connected.

Embodiment

1. Circuit Configuration of Radio Frequency Module 1 and Communication Device 5

FIG. 1 illustrates a circuit configuration of radio frequency module 1 and communication device 5 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4.

RFIC 3 is an RF signal processing circuit that processes radio frequency signals transmitted and received by antenna 2. Specifically, RFIC 3 processes a reception signal input through a reception path of radio frequency module 1 by down-conversion, for instance, and outputs a reception signal generated by being processed to BBIC 4. Further, RFIC 3 outputs a radio frequency signal processed based on a signal input from BBIC 4 to a transmission path of radio frequency module 1.

BBIC 4 is a circuit that processes data using a signal of a frequency lower than a radio frequency signal transferred in radio frequency module 1. A signal processed by BBIC 4 is used, for example, as an image signal for image display or as an audio signal for talk through a loudspeaker.

Further, RFIC 3 functions as a controller that controls connection made by switch 40 included in radio frequency module 1, based on a communication band (frequency band) to be used. Specifically, RFIC 3 changes connection made by switch 40 included in radio frequency module 1 according to a control signal (not illustrated). Note that the controller may be provided outside of RFIC 3, for example, in radio frequency module 1 or BBIC 4.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes antenna connection terminal 100, power amplifier 10, low noise amplifier 20, transmission filter 30T, reception filter 30R, and switch 40.

Antenna connection terminal 100 is connected to antenna 2.

Power amplifier 10 amplifies a transmission signal of communication band A input through transmission input terminal 110.

Low noise amplifier 20 amplifies a reception signal of communication band A while noise is kept low, and outputs the amplified signal to reception output terminal 120.

Transmission filter 30T is disposed on transmission path AT that connects antenna connection terminal 100 and transmission input terminal 110, and passes a transmission signal of communication band A included in a transmission signal amplified by power amplifier 10.

Reception filter 30R is disposed on reception path AR that connects antenna connection terminal 100 and reception output terminal 120, and passes a reception signal of communication band A included in a reception signal input through antenna connection terminal 100.

Transmission filter 30T and reception filter 30R are included in duplexer 30 having a passband that is communication band A.

Switch 40 is an example of an antenna switch, is connected to antenna connection terminal 100, and switches between (1) connection of antenna connection terminal 100 between transmission path AT and reception path AR, and (2) connection of antenna connection terminal 100 between another transmission path and another reception path. Note that switch 40 may include a multi-connection switching circuit that can simultaneously make connections (1) and (2) above.

Note that impedance matching circuits, filters, and switches, for instance, may be further disposed on signal paths included in radio frequency module 1.

In the configuration of radio frequency module 1, power amplifier 10, transmission filter 30T, and switch 40 are included in a transmission circuit that transfers a transmission signal of communication band A toward antenna connection terminal 100. Switch 40, reception filter 30R, and low noise amplifier 20 are included in a reception circuit that transfers a reception signal of communication band A via antenna connection terminal 100 from antenna 2.

According to the above circuit configuration, radio frequency module 1 can carry out at least one of transmission, reception, or transmission and reception of radio frequency signals of communication band A.

Note that radio frequency module 1 may include a transmission circuit that transfers a transmission signal of a communication band different from communication band A and a reception circuit that transfers a reception signal of a communication band different from communication band A, in addition to the transmission circuit and the reception circuit. In radio frequency module 1, the transmission circuit and the reception circuit may be connected to antenna connection terminal 100 without switch 40 being provided therebetween.

Power amplifier 10 and low noise amplifier 20 each include, for instance, a field effect transistor (FET) or a hetero-bipolar transistor (HBT) made of, for example, a Si-based complementary metal oxide semiconductor (CMOS) or GaAs.

Low noise amplifier 20 and switch 40 may be formed in a semiconductor integrated circuit (IC). The semiconductor IC may further include power amplifier 10. The semiconductor IC includes a CMOS, for example. Specifically, the semiconductor IC is formed by the silicon on insulator (SOI) process. Accordingly, the semiconductor IC can be manufactured at a low cost. Note that the semiconductor IC may include at least one of GaAs, SiGe, or GaN. Thus, a radio frequency signal having high amplification quality and high noise quality can be output.

In radio frequency module 1 according to the present embodiment, transmission filter 30T and reception filter 30R are included in duplexer 30 that transfers a transmission signal and a reception signal using the frequency division duplex (FDD) scheme, but may transfer a transmission signal and a reception signal using the time division duplex (TDD) scheme. In this case, a switch or switches that switch between transmission and reception are disposed upstream or downstream or upstream and downstream from transmission filter 30T and reception filter 30R.

Each of transmission filter 30T and reception filter 30R may be one of (1) an acoustic-velocity film stacked acoustic wave filter, (2) a temperature-compensating LN substrate acoustic wave filter, (3) a LT substrate acoustic wave filter, and (4) a bulk acoustic wave filter.

The following describes structures and characteristics of acoustic wave filters (1) to (4) stated above.

2. Structure and Characteristics of Acoustic Wave Filter

Figure 2A:
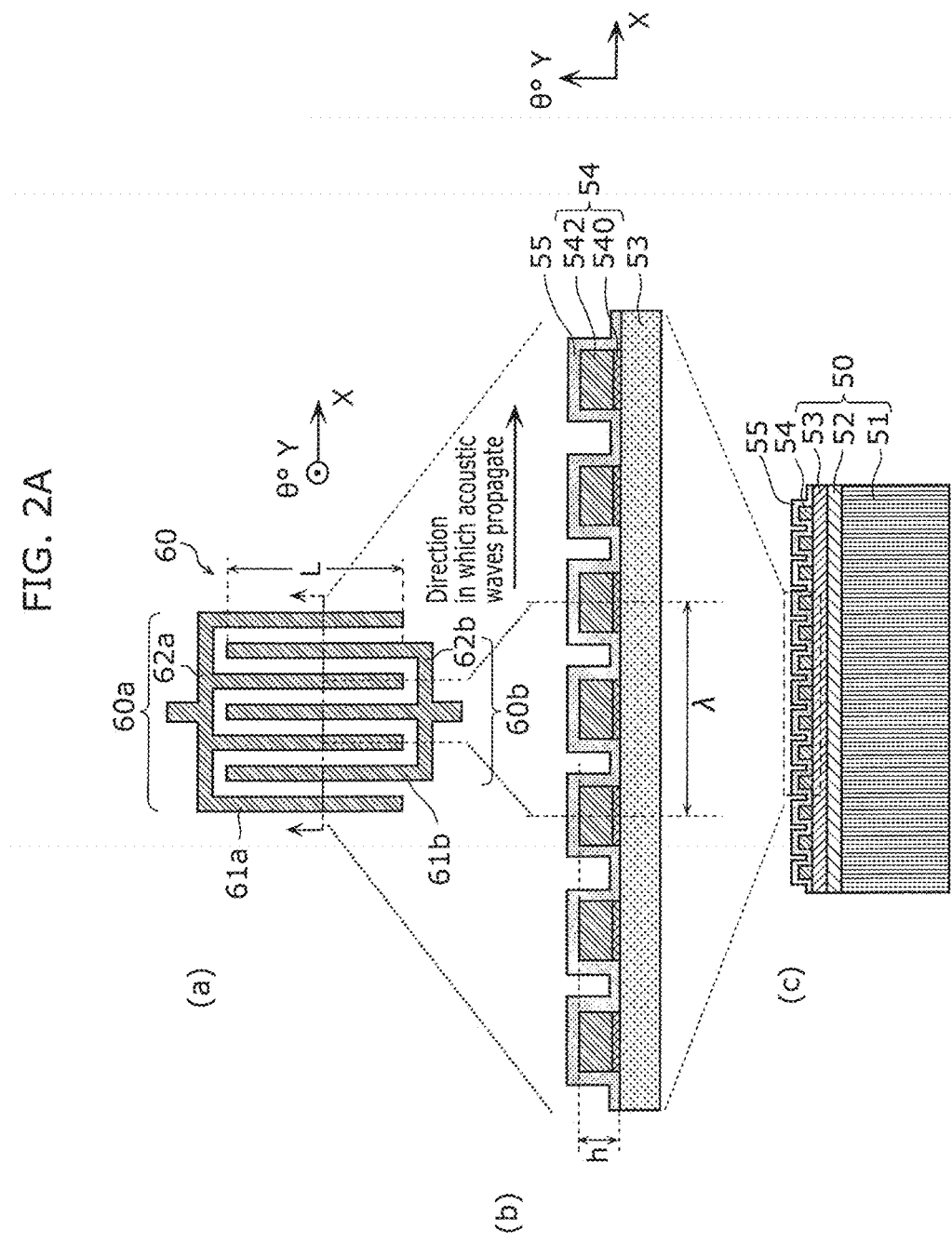
FIG. 2A illustrates a plan view and cross-sectional views each schematically illustrating a structure of an acoustic-velocity film stacked acoustic wave filter.

FIG. 2A illustrates a plan view and cross-sectional views each schematically showing a structure of an acoustic-velocity film stacked acoustic wave filter. Specifically, FIG. 2A is a schematic diagram illustrating schematically an example of acoustic wave resonator 60 included in the acoustic-velocity film stacked acoustic wave filter. Part (a) is a plan view of interdigital transducer (IDT) electrode 54 included in acoustic wave resonator 60, and (b) and (c) are cross-sectional views of acoustic wave resonator 60 illustrated in (a) taken along the dashed dotted line.

Note that types of acoustic wave filters (1) to (4) stated above include, for example, a ladder filter in which a plurality of acoustic wave resonators 60 illustrated in FIG. 2A are disposed in series and in parallel, or a longitudinally coupled filter in which a plurality of acoustic wave resonators 60 illustrated in FIG. 2A are disposed in a direction in which acoustic waves propagate. Note that acoustic wave resonator 60 illustrated in FIG. 2A is for describing a typical structure and, for example, the number and the length, for instance, of electrode fingers included in IDT electrode 54 of acoustic wave resonator 60 are not limited to the illustrated structure.

One acoustic wave resonator 60 included in the acoustic-velocity film stacked acoustic wave filter includes piezoelectric board 50, IDT electrode 54, and protective layer 55, as illustrated in (c) of FIG. 2A.

As illustrated in (a) of FIG. 2A, pairs of comb-shaped electrodes 60a and 60b facing each other are formed on board 50. Comb-shaped electrode 60a includes electrode fingers 61a parallel to each other, and bus bar electrode 62a that connects electrode fingers 61a. Comb-shaped electrode 60b includes a plurality of electrode fingers 61b parallel to each other, and bus bar electrode 62b that connects electrode fingers 61b. Electrode fingers 61a and 61b are formed orthogonally to the direction in which acoustic waves propagate (X-axis direction).

As illustrated in (b) of FIG. 2A, IDT electrode 54 that includes electrode fingers 61a and 61b and bus bar electrodes 62a and 62b has a structure in which adhesion layer 540 and main electrode layer 542 are stacked, for example.

Adhesion layer 540 is for improving adhesion between board 50 and main electrode layer 542, and is made of, for example, Ti. For example, Al that contains 1% of Cu is used for the material of main electrode layer 542.

Protective layer 55 covers comb-shaped electrodes 60a and 60b. Protective layer 55 is intended to protect main electrode layer 542 from the outside environment, adjust frequency-temperature characteristics, and improve moisture resistance, for instance, and is a dielectric film for which silicon dioxide, for example, is used as a major component.

Note that the materials of adhesion layer 540, main electrode layer 542, and protective layer 55 are not limited to those stated above. Furthermore, IDT electrode 54 may not have a stacked structure as described above. IDT electrode 54 may include metal such as Ti, Al, Cu, Pt, Au, Ag, or Pd or an alloy of at least two of the metals, for example. Alternatively, IDT electrode 54 may include a stack of such metals or alloys. Protective layer 55 may not be formed.

Next, a stacked structure of board 50 is to be described.

As illustrated in (c) of FIG. 2A, board 50 includes high acoustic velocity support board 51, low acoustic velocity film 52, and piezoelectric film 53, and has a structure in which high acoustic velocity support board 51, low acoustic velocity film 52, and piezoelectric film 53 are stacked in this order.

For example, piezoelectric film 53 is made of a θ° Y-cut X propagation $LiTaO_3$ piezoelectric single crystal or piezoelectric ceramic (a lithium tantalate single crystal or ceramic in which acoustic surface waves propagate in the X-axis direction, and which is obtained by being cut along a plane to which an axis is normal that is rotated through θ° from the Y axis with respect to the X axis used as the central axis). Note that the material and cut angle θ of a piezoelectric single crystal used as piezoelectric film 53 may be selected as appropriate, according to requirement specification of each filter.

High acoustic velocity support board 51 supports low acoustic velocity film 52, piezoelectric film 53, and IDT electrode 54. High acoustic velocity support board 51 is a high acoustic velocity layer in which the acoustic velocity of bulk waves in high acoustic velocity support board 51 is higher than the velocity of acoustic waves that propagate through piezoelectric film 53 such as surface waves and boundary waves, and functions to confine surface acoustic waves in a portion on which piezoelectric film 53 and low acoustic velocity film 52 are stacked, to prevent leakage of the surface acoustic waves into high acoustic velocity support board 51. High acoustic velocity support board 51 is a silicon substrate, for example.

Low acoustic velocity film 52 is a film in which the acoustic velocity of bulk waves in low acoustic velocity film 52 is lower than the acoustic velocity of bulk waves that propagate through piezoelectric film 53, and is disposed between piezoelectric film 53 and high acoustic velocity support board 51. Because of this structure and the property of acoustic waves that the energy thereof basically concentrates in a lower acoustic velocity medium, the energy of surface acoustic waves can be prevented from leaking outside the IDT electrode. Low acoustic velocity film 52 includes silicon dioxide as a major component, for example.

Thus, the acoustic-velocity film stacked acoustic wave filter has a structure in which a plurality of layers having different bulk wave acoustic velocities (a low acoustic velocity layer and a high acoustic velocity layer) are stacked.

Note that according to the above stacked structure of board 50, the Q factors at a resonance frequency and an antiresonant frequency can be significantly increased, as compared with a structure that uses a single layer of a piezoelectric board. Thus, an acoustic wave resonator having high Q factors can be obtained, and thus a filter with less insertion loss can be achieved using the acoustic wave resonator.

Note that high acoustic velocity support board 51 may have a structure in which a support board and a high acoustic velocity film in which the acoustic velocity of propagating bulk waves is higher than the acoustic velocity of acoustic waves that propagate through piezoelectric film 53 such as surface waves and boundary waves are stacked. In this case, piezoelectric crystals such as sapphire, lithium tantalate, lithium niobate, and quartz, various ceramics such as alumina, magnesia, silicon nitride, aluminum nitride, silicon carbide, zirconia, cordylite, porcelainite, steatite, and forsterite, a dielectric such as glass, semiconductors such as silicon and gallium nitride, and a resin substrate, for instance, can be used for the support board. Various high acoustic velocity materials such as aluminum nitride, aluminum oxide, silicon carbide, silicon nitride, silicon oxynitride, a diamond-like carbon (DLC) film, and diamond, a medium that includes such a material as a major component, and a medium that includes a mixture of such materials as a major component can be used for the high acoustic velocity film.

Note that board 50 included in the acoustic-velocity film stacked acoustic wave filter may not have the above-described structure in which high acoustic velocity support board 51, low acoustic velocity film 52, and piezoelectric film 53 are stacked in this order, but may rather have a stacked structure as below.

Specifically, board 50 may have a structure in which a support board, an energy confining layer, and a piezoelectric film are stacked in this order. IDT electrode 54 is formed on the piezoelectric film. A LiTaO$_3$ piezoelectric single crystal or piezoelectric ceramic is used for the piezoelectric film, for example. The support board supports the piezoelectric film, the energy confining layer, and IDT electrode 54.

The energy confining layer has a structure in which a plurality of layers having different acoustic impedances are stacked and, for example, low acoustic impedance layers each having a relatively low acoustic impedance and high acoustic impedance layers each having a relatively high acoustic impedance are alternately stacked.

Thus, an acoustic-velocity film stacked acoustic wave filter may have a structure of stacks of layers having a structure in which a plurality of layers having different acoustic impedances are stacked (low acoustic impedance layers and high acoustic impedance layers are stacked).

In this specification, a filter having a structure in which a plurality of layers having different bulk wave acoustic velocities are stacked or a structure in which a plurality of layers having different acoustic impedances are stacked is hereinafter stated as an acoustic-velocity film stacked acoustic wave filter.

Figure 2B:
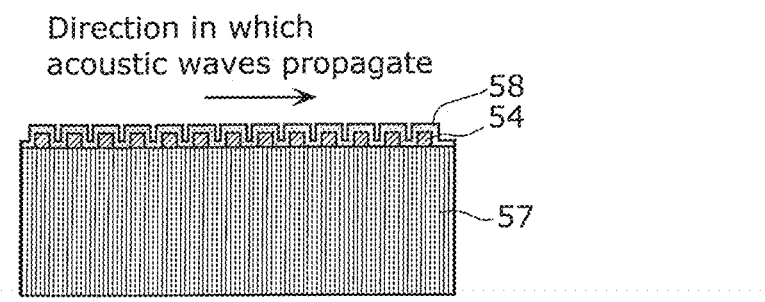
FIG. 2B illustrates a cross section schematically showing a structure of a temperature-compensating lithium niobate (LN) substrate acoustic wave filter.

FIG. 2B illustrates a cross section schematically showing a structure of a temperature-compensating LN substrate acoustic wave filter (TC-SAW). In the acoustic-velocity film stacked acoustic wave filter illustrated in FIG. 2A, IDT electrode 54 is formed on piezoelectric board 50. In contrast, in the temperature-compensating LN substrate acoustic wave filter, as illustrated in FIG. 2B, a board on which IDT electrode 54 is formed may be board 57 made of a single piezoelectric layer. The temperature-compensating LN substrate acoustic wave filter includes, for example, board 57, IDT electrode 54, and temperature compensating layer 58, and has a configuration in which board 57, IDT electrode 54, and temperature compensating layer 58 are stacked in this order.

Board 57 is made of a LiNbO$_3$ piezoelectric single crystal or a LiNbO$_3$ piezoelectric ceramic. Note that the cut angle may be changed as appropriate according to desired passing characteristics of an acoustic wave filter, for instance.

IDT electrode 54 has the same configuration as that of IDT electrode 54 illustrated in (b) of FIG. 2A.

Temperature compensating layer 58 is formed above board 57 and on IDT electrode 54. Temperature compensating layer 58 is an insulating layer intended to decrease the absolute value of a temperature coefficient of frequency (TCF, which is a measure of a thermal stability of a resonator), and is, for example, a dielectric film that includes silicon dioxide as a major component. Note that temperature compensating layer 58 may further have functions of protecting main electrode layer 542 from the outside environment and improving moisture resistance, for instance.

Thus, the temperature-compensating LN substrate acoustic wave filter uses surface acoustic waves that propagate through the piezoelectric board which is made of LiNbO$_3$ and above which an insulating layer for adjusting frequency-temperature characteristics is formed.

In this specification, a filter that uses surface acoustic waves that propagate through a piezoelectric board which is made of LiNbO$_3$, and above which an insulating layer for adjusting frequency-temperature characteristics is formed is hereinafter stated as a temperature-compensating LN substrate acoustic wave filter.

Figure 2C:
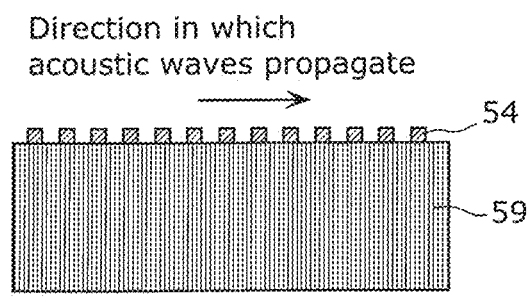
FIG. 2C illustrates a cross section schematically showing a structure of a lithium tantalate (LT) substrate acoustic wave filter.

FIG. 2C illustrates a cross section schematically showing a structure of a LT substrate acoustic wave filter (LT-SAW). In the LT substrate acoustic wave filter, a board on which IDT electrode 54 is formed may be board 59 made of a single piezoelectric layer, as illustrated in FIG. 2C. The LT substrate acoustic wave filter includes, for example, board 59 and IDT electrode 54, and has a configuration in which board 59 and IDT electrode 54 are stacked.

Board 59 is made of a LiTaO$_3$ piezoelectric single crystal or a LiTaO$_3$ piezoelectric ceramic. Note that the cut angle may be changed as appropriate according to desired passing characteristics of an acoustic wave filter, for instance.

IDT electrode 54 has the same configuration as that of IDT electrode 54 illustrated in (b) of FIG. 2A.

Note that in the LT substrate acoustic wave filter, a protective layer intended to protect main electrode layer 542 from the outside environment and improve moisture resistance, for instance, may be formed above board 59 and on IDT electrode 54. The protective layer is a dielectric film that includes silicon dioxide as a major component, for example.

Thus, the LT substrate acoustic wave filter uses surface acoustic waves that propagate through the piezoelectric board made of LiTaO$_3$.

In this specification, a filter that uses surface acoustic waves that propagate through a piezoelectric board made of LiTaO$_3$ is hereinafter stated as an LT substrate acoustic wave filter.

Figure 2D:
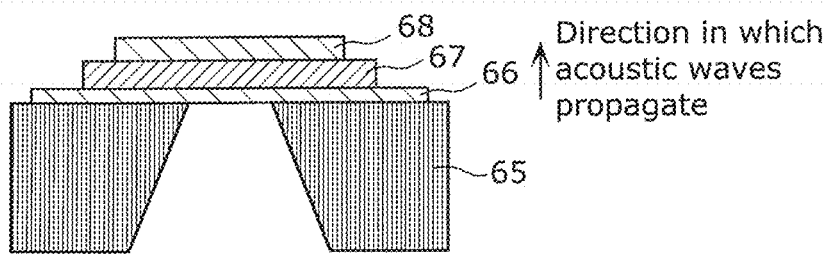
FIG. 2D illustrates a cross section schematically showing a structure of a bulk acoustic wave filter.

FIG. 2D illustrates a cross section schematically showing a structure of a bulk acoustic wave filter (BAW). As illustrated in FIG. 2D, the bulk acoustic wave filter includes, for example, support board 65, lower electrode 66, piezoelectric film 67, and upper electrode 68, and has a configuration in which support board 65, lower electrode 66, piezoelectric film 67, and upper electrode 68 are stacked in this order.

Support board 65 is for supporting lower electrode 66, piezoelectric film 67, and upper electrode 68, and is a silicon substrate, for example. Note that support board 65 has a cavity in a region in contact with lower electrode 66. Accordingly, piezoelectric film 67 is allowed to freely vibrate.

For example, Al that contains 1% of Cu is used as the material of lower electrode 66 and upper electrode 68.

Piezoelectric film 67 includes, for example, at least one of ZnO (zinc oxide), AlN (aluminum nitride), PZT (lead zirconate titanate), KN (potassium niobate), LN (lithium niobate), LT (lithium tantalate), quartz, or LiBO (lithium borate) as a major component.

In the above configuration of the bulk acoustic wave filter, lower electrode 66, piezoelectric film 67, and upper electrode 68 are included in a bulk acoustic wave (BAW) resonator. The BAW resonator generates resonance by applying electrical energy between lower electrode 66 and upper electrode 68 to induce bulk acoustic waves within piezoelectric film 67. The bulk acoustic waves generated by the BAW resonator propagate between lower electrode 66 and upper electrodes 68 in the direction perpendicular to the surface of piezoelectric film 67.

Thus, the bulk acoustic wave filter uses bulk acoustic waves.

In this specification, a filter that uses bulk acoustic waves is hereinafter stated as a bulk acoustic wave filter.

Figure 3A:
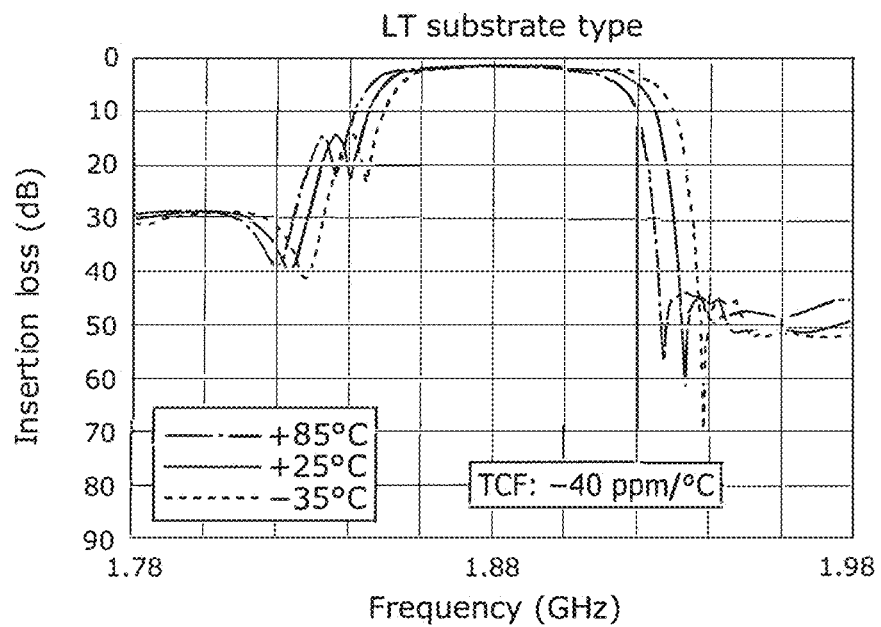
FIG. 3($a$) illustrates a graph showing passing characteristics of a LT substrate acoustic wave filter and FIG. 3($b$) illustrates a graph showing passing characteristics of an acoustic-velocity film stacked acoustic wave filter.
Figure 3B:
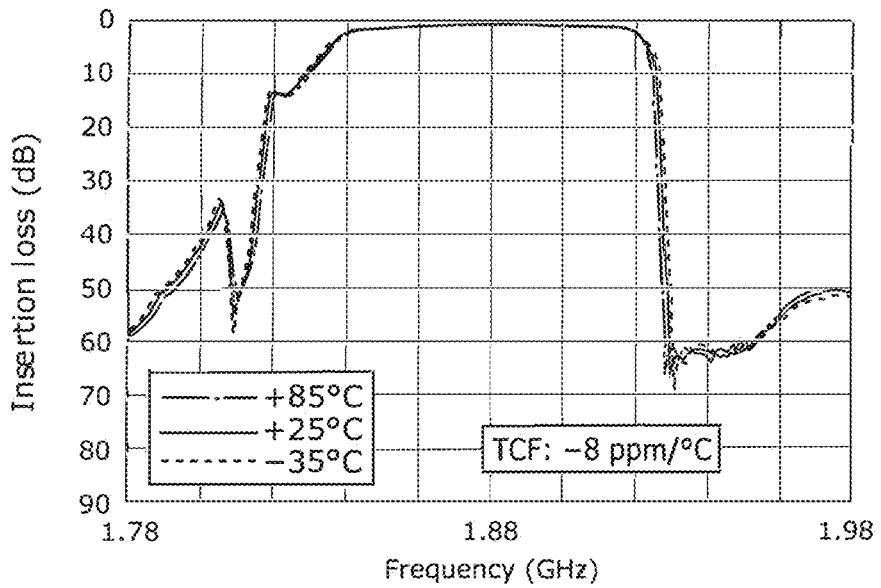

FIGS. 3(a) and 3(b) illustrate graphs showing passing characteristics of a LT substrate acoustic wave filter and an acoustic-velocity film stacked acoustic wave filter. FIG. 3(a) illustrates passing characteristics of the LT substrate acoustic wave filter with respect to temperature changes, and FIG. 3(b) illustrates passing characteristics of the acoustic-velocity film stacked acoustic wave filter with respect to temperature changes. As illustrated in FIGS. 3(a) and 3(b), passing characteristics of the acoustic wave filters shift to lower frequencies when a temperature is high (+85° C. in FIGS. 3(a) and 3(b)), and passing characteristics thereof shift to higher frequencies when a temperature is low (−35° C. in FIGS. 3(a) and 3(b)).

Here, as illustrated in FIG. 3(a), the TCF of the LT substrate acoustic wave filter that indicates the degree of a frequency shift with respect to temperature changes is, for example, −40 ppm/° C. On the other hand, as illustrated in FIG. 3(b), the TCF of the acoustic-velocity film stacked acoustic wave filter is −8 ppm/° C., for example. Thus, the absolute value of the TCF of the acoustic-velocity film stacked acoustic wave filter is smaller than the absolute value of the TCF of the LT substrate acoustic wave filter.

Table 1 shows typical TCFs of acoustic wave filters.

TABLE 1

| Types of filters | Temperature coefficient of frequency TCF (ppm/° C.) | |
| --- | --- | --- |
| Acoustic-velocity film stacked acoustic wave filter | 0 to −10 | |
| Temperature-compensating LN substrate acoustic wave filter (TC-SAW) | −25 to −35 | Rayleigh waves: −25 Love waves: −30 to −35 |
| LT substrate acoustic wave filter (LT-SAW) | −45 | |
| Bulk acoustic wave filter (BAW) | −30 | |

Table 1 shows that the absolute value of the TCF of the acoustic-velocity film stacked acoustic wave filter is smaller than the absolute values of the TCFs of the bulk acoustic wave filter, the LT substrate acoustic wave filter, and the temperature-compensating LN substrate acoustic wave filter.

The absolute value of the TCF of the bulk acoustic wave filter is smaller than the absolute value of the TCF of the LT substrate acoustic wave filter.

The absolute value of the TCF of the temperature-compensating LN substrate acoustic wave filter is smaller than the absolute value of the TCF of the LT substrate acoustic wave filter.

Here, if circuit elements included in radio frequency module 1 described above are mounted, as a small front-end circuit, on a single module board, it is necessary to decrease the area for arranging the circuit components on the surface of the module board. In this case, if a power amplifier that generates a great amount of heat is disposed on the module board, the temperature of radio frequency module 1 locally changes. A change in temperature of radio frequency module 1 causes a problem that passing characteristics of the acoustic wave filters having frequency-temperature characteristics change as described above, so that signal-transfer characteristics of radio frequency module 1 deteriorate.

In contrast, radio frequency module 1 according to the present embodiment has a configuration that reduces a change in passing characteristics of an acoustic wave filter that is caused by heat generated by a power amplifier. The following describes a configuration that reduces a change in passing characteristics of the acoustic wave filter according to the present embodiment.

3. Arrangement of Circuit Elements of Radio Frequency Module 1A According to Example 1

Figure 4B:
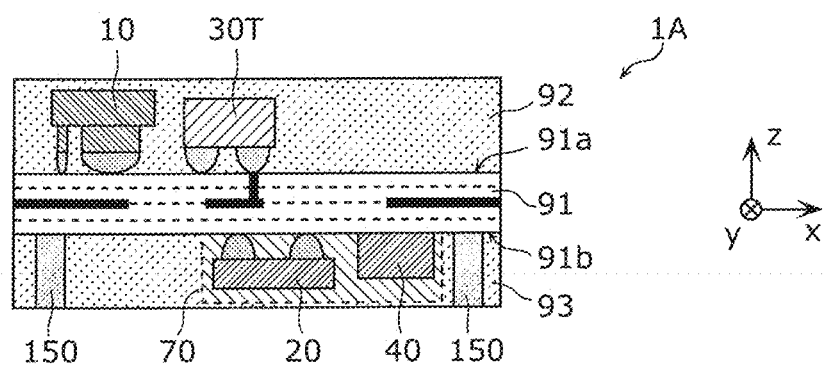
FIG. 4B is a schematic diagram illustrating a cross-sectional configuration of the radio frequency module according to Example 1.

FIG. 4A is a schematic diagram illustrating a planar configuration of radio frequency module 1A according to Example 1. FIG. 4B is a schematic diagram illustrating a cross-sectional configuration of radio frequency module 1A according to Example 1 and specifically, is a cross-sectional view taken along line IVB-IVB in FIG. 4A. Note that (a) of FIG. 4A illustrates a layout of circuit elements when principal surface 91a is viewed from the positive z-axis, out of principal surfaces 91a and 91b on opposite sides of module board 91. On the other hand, (b) of FIG. 4A is a perspective view of the layout of circuit elements when principal surface 91b is viewed from the positive z-axis.

Radio frequency module 1A according to Example 1 shows a specific arrangement of circuit elements included in radio frequency module 1 according to the embodiment.

As illustrated in FIGS. 4A and 4B, radio frequency module 1A according to this example includes module board 91, resin members 92 and 93, and external-connection terminals 150, in addition to the circuit configuration illustrated in FIG. 1.

Module board 91 is a board that includes principal surface 91a (a first principal surface) and principal surface 91b (a second principal surface) on opposite sides of module board 91, and on which a transmission circuit and a reception circuit as described above are mounted. For example, as module board 91, one of a low temperature co-fired ceramics (LTCC) board, a high temperature co-fired ceramics (HTCC) board, a component-embedded board, a board that includes a redistribution layer (RDL), and a printed circuit board each having a stacked structure of a plurality of dielectric layers, for example, is used.

Resin member 92 is disposed on principal surface 91a of module board 91, covers a portion of the transmission circuit, a portion of the reception circuit, and principal surface 91a of module board 91, and has a function of ensuring reliability of mechanical strength and moisture resistance of circuit elements included in the transmission circuit and the reception circuit. Resin member 93 is disposed on principal surface 91b of module board 91, covers a portion of the transmission circuit, a portion of the reception circuit, and principal surface 91b of module board 91, and has a function of ensuring reliability of mechanical strength and moisture resistance of circuit elements included in the transmission circuit and the reception circuit. Note that resin members 92 and 93 are not necessarily included in the radio frequency module according to the present disclosure.

As illustrated in FIGS. 4A and 4B, in radio frequency module 1A according to this example, power amplifier 10, transmission filter 30T, and reception filter 30R are disposed on principal surface 91a (a first principal surface) of module board 91. On the other hand, low noise amplifier 20 and switch 40 are disposed on principal surface 91b (a second principal surface) of module board 91. Note that switch 40 may be disposed on principal surface 91a.

Transmission filter 30T is an example of a first acoustic wave filter, and reception filter 30R is an example of a second acoustic wave filter. Here, the absolute value of a TCF of transmission filter 30T is smaller than the absolute value of a TCF of reception filter 30R. Stated differently, the absolute value of the TCF of the first acoustic wave filter is smaller than the absolute value of the TCF of the second acoustic wave filter.

As illustrated in (a) of FIG. 4A, distance $D_{30T}$ between transmission filter 30T and power amplifier 10 is shorter than distance $D_{30R}$ between reception filter 30R and power amplifier 10.

According to the configuration of radio frequency module 1A as described above, reception filter 30R whose TCF has a relatively large absolute value is more spaced apart from power amplifier 10 that generates a great amount of heat than transmission filter 30T whose TCF has a relatively small absolute value. Accordingly, although distance $D_{30T}$ between transmission filter 30T and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R has a TCF whose absolute value is relatively large, distance $D_{30R}$ between reception filter 30R and power amplifier 10 is great, and thus transmission filter 30R is subjected to a small change in temperature caused by power amplifier 10 so that reception filter 30R can reduce a change in passing characteristics. Accordingly, deterioration of transfer characteristics of radio frequency module 1A due to a temperature change can be prevented.

Note that in this example, the absolute value of the TCF of transmission filter 30T is smaller than the absolute value of the TCF of reception filter 30R. A high-power transmission signal amplified by power amplifier 10 is input to transmission filter 30T, and thus the temperature of transmission filter 30T readily increases. Accordingly, the absolute value of the TCF of transmission filter 30T is desirably small. Note that if radio frequency module 1A is configured so as not to be greatly influenced by an increase in the temperature due to the power level of an input signal, the absolute value of the TCF of transmission filter 30T may be greater than the absolute value of the TCF of reception filter 30R. Note that in this case, distance $D_{30T}$ between transmission filter 30T and power amplifier 10 is set to a distance greater than distance $D_{30R}$ between reception filter 30R and power amplifier 10.

Thus, the radio frequency module according to the present disclosure has features that when the absolute value of the TCF of the first acoustic wave filter is smaller than the absolute value of the TCF of the second acoustic wave filter, a distance between the first acoustic wave filter and power amplifier 10 is shorter than the distance between the second acoustic wave filter and power amplifier 10.

In this example, transmission filter 30T and reception filter 30R are both disposed on principal surface 91a (the first principal surface), yet transmission filter 30T and reception filter 30R may be separately disposed on principal surfaces 91a and 91b.

Also in this case, if distance $D_{30T}$ between transmission filter 30T and power amplifier 10 is shorter than distance $D_{30R}$ between reception filter 30R and power amplifier 10, deterioration of transmission characteristics of radio frequency module 1A due to a temperature change can be reduced.

In radio frequency module 1A according to this example, transmission filter 30T (the first acoustic wave filter) may be a bulk acoustic wave filter, and reception filter 30R (the second acoustic wave filter) may be a LT substrate acoustic wave filter.

According to this, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus a temperature change caused by power amplifier 10 is small so that reception filter 30R can reduce a change in passing characteristics. Accordingly, deterioration of transfer characteristics of radio frequency module 1A due to a temperature change can be prevented.

In radio frequency module 1A according to this example, transmission filter 30T (the first acoustic wave filter) may be an acoustic-velocity film stacked acoustic wave filter, and reception filter 30R (the second acoustic wave filter) may be one of a bulk acoustic wave filter, a LT substrate acoustic wave filter, and a temperature-compensating LN substrate acoustic wave filter.

According to this, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus a temperature change caused by power amplifier 10 is small so that reception filter 30R can reduce a change in passing characteristics. Accordingly, deterioration of transfer characteristics of radio frequency module 1A due to a temperature change can be prevented.

In radio frequency module 1A according to this example, transmission filter 30T (the first acoustic wave filter) may be a temperature-compensating LN substrate acoustic wave filter, and reception filter 30R (the second acoustic wave filter) may be a LT substrate acoustic wave filter.

According to this, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus a temperature change caused by power amplifier 10 is small so that reception filter 30R can reduce a change in passing characteristics. Accordingly, deterioration of transfer characteristics of radio frequency module 1A due to a temperature change can be prevented.

In radio frequency module 1A according to this example, plural external-connection terminals 150 are disposed on principal surface 91b (the second principal surface) of module board 91. Radio frequency module 1A exchanges, via external-connection terminals 150, electrical signals with a motherboard disposed on the z-axis negative side of radio frequency module 1A. As illustrated in (b) of FIG. 4A, external-connection terminals 150 may be disposed in a perimeter region of principal surface 91b. Some of external-connection terminals 150 are set to the ground potential of the motherboard.

According to the arrangement of external-connection terminals 150 as described above, external-connection terminals 150 used as ground electrodes are disposed around low noise amplifier 20, and thus the inflow of extraneous noise to the reception circuit can be prevented.

In radio frequency module 1A according to this example, external-connection terminals 150 may be disposed on principal surface 91b, transmission filter 30T (the first acoustic wave filter) may be disposed on principal surface 91b, and reception filter 30R (the second acoustic wave filter) may be disposed on principal surface 91a. In this case, transmission filter 30T (the first acoustic wave filter) may be an acoustic-velocity film stacked acoustic wave filter. The acoustic-velocity film stacked acoustic wave filter includes a silicon substrate, and thus the height thereof can be decreased by polishing the silicon substrate.

According to this, low noise amplifier 20, switch 40, and the acoustic-velocity film stacked acoustic wave filter each having height that is readily decreased are disposed on principal surface 91b facing the motherboard, and thus the height of radio frequency module 1A as a whole can be decreased.

In radio frequency module 1A according to this example, power amplifier 10 is mounted on principal surface 91a (the first principal surface).

Power amplifier 10 is a component that generates a great amount of heat, out of the circuit components included in radio frequency module 1A. In order to improve heat dissipating properties of radio frequency module 1A, it is important to dissipate heat generated by power amplifier 10 to the motherboard through a heat dissipation path having low heat resistance. If power amplifier 10 is mounted on principal surface 91b, an electrode line connected to power amplifier 10 is disposed on principal surface 91b. Accordingly, the heat dissipation path includes a heat dissipation path that extends along only a planar line pattern (in the direction of the xy plane) on principal surface 91b. The planar line pattern is formed using a thin metal film, and thus has high heat resistance. Accordingly, if power amplifier 10 is disposed on principal surface 91b, heat dissipating properties deteriorate.

In contrast, if power amplifier 10 is mounted on principal surface 91a, power amplifier 10 and external-connection terminals 150 can be connected via through electrodes passing through module board 91 from principal surface 91a to principal surfaces 91b. Accordingly, as a heat dissipation path of power amplifier 10, a heat dissipation path that extends along only a planar line pattern having high heat resistance and extending in the direction of the xy plane can be eliminated from lines in and on module board 91. Accordingly, radio frequency module 1A having improved properties of heat dissipation from power amplifier 10 to the motherboard can be provided.

Note that from the viewpoint of heat dissipating properties, as illustrated in (b) of FIG. 4A, it is desirable to dispose the through electrodes or a heat dissipation member in a region in principal surface 91b opposing the region in principal surface 91a on which power amplifier 10 is disposed, and thus it is desirable that no circuit element is disposed in the region in principal surface 91b.

In this example, power amplifier 10 is disposed on principal surface 91a, and low noise amplifier 20 is disposed on principal surface 91b. According to this, power amplifier 10 and low noise amplifier 20 are disposed with module board 91 therebetween, and thus isolation between transmission and reception can be improved.

As illustrated in FIGS. 4A and 4B, low noise amplifier 20 and switch 40 may be provided in single semiconductor IC 70. Accordingly, the height from principal surface 91b in the z-axis direction can be decreased, and the area for mounting components on principal surface 91b can be decreased. Accordingly, radio frequency module 1A can be miniaturized.

Figure 4C:
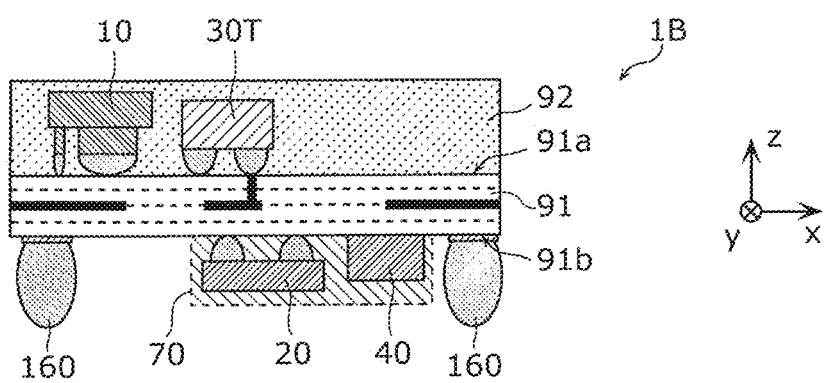
FIG. 4C is a schematic diagram illustrating a cross-sectional configuration of a radio frequency module according to a variation.

Note that external-connection terminals 150 may be columnar electrodes passing through resin member 93 in the z-axis direction as illustrated in FIGS. 4A and 4B or may be bump electrodes 160 formed on principal surface 91b as illustrated in FIG. 4C. If external-connection terminals 150 are bump electrodes 160, resin member 93 is not disposed on principal surface 91b as illustrated in FIG. 4C.

In radio frequency module 1A according to this example, external-connection terminals 150 may be disposed on principal surface 91a.

Note that in radio frequency module 1A according to this example, when transmission filter 30T (the first acoustic wave filter) is a bulk acoustic wave filter, and reception filter 30R (the second acoustic wave filter) is a LT substrate acoustic wave filter, the absolute value of the TCF of the first acoustic wave filter is always smaller than the absolute value of the TCF of the second acoustic wave filter. Accordingly, in this case, it is not necessary to regard, as a feature of the present application, the fact that the absolute value of the TCF of the first acoustic wave filter is smaller than the absolute value of the TCF of the second acoustic wave filter.

In radio frequency module 1A according to this example, when transmission filter 30T (the first acoustic wave filter) is an acoustic-velocity film stacked acoustic wave filter, and reception filter 30R (the second acoustic wave filter) is one of a bulk acoustic wave filter, a LT substrate acoustic wave filter, and a temperature-compensating LN substrate acoustic wave filter, the absolute value of the TCF of the first acoustic wave filter is always smaller than the absolute value of the TCF of the second acoustic wave filter. Accordingly, in this case, it is not necessary to regard, as a feature of the present application, the fact that the absolute value of the TCF of the first acoustic wave filter is smaller than the absolute value of the TCF of the second acoustic wave filter.

4. Arrangement of Circuit Elements of Radio Frequency Module 1C According to Example 2

Figure 5A:
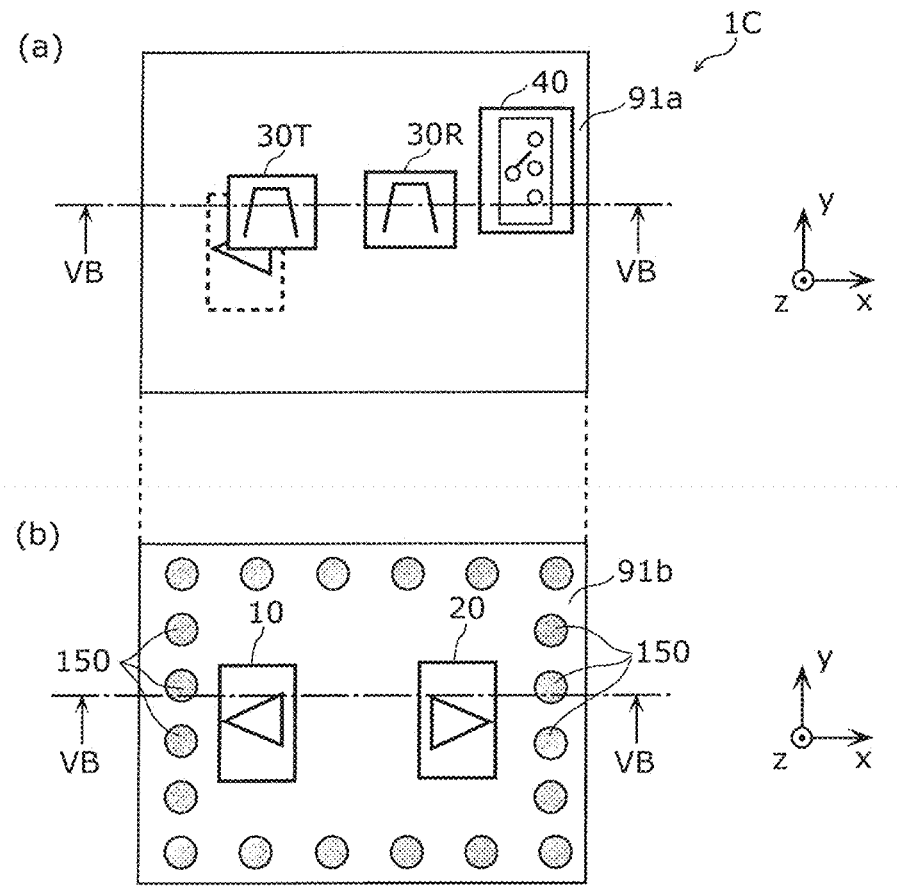
FIG. 5A is a schematic diagram illustrating a planar configuration of a radio frequency module according to Example 2.
Figure 5B:
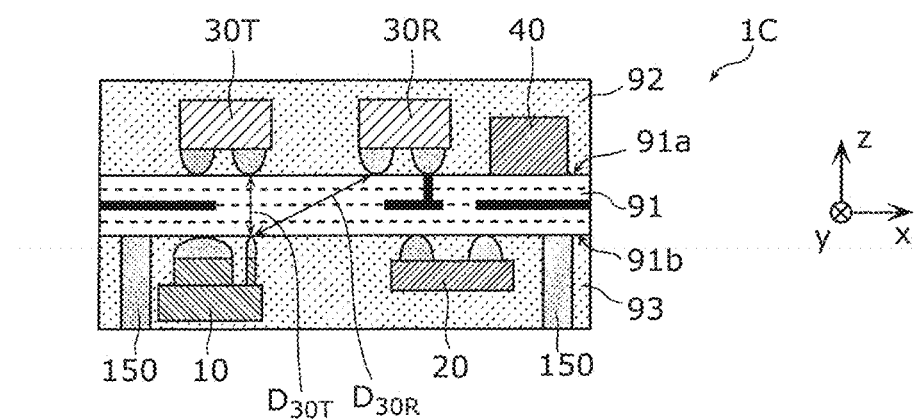
FIG. 5B is a schematic diagram illustrating a cross-sectional configuration of the radio frequency module according to Example 2.

FIG. 5A is a schematic diagram illustrating a planar configuration of radio frequency module 1C according to Example 2. FIG. 5B is a schematic diagram illustrating a cross-sectional configuration of radio frequency module 1C according to Example 2 and specifically, is a cross-sectional view taken along line VB-VB in FIG. 5A. Note that (a) of FIG. 5A illustrates a layout of circuit elements when principal surface 91a is viewed from the positive z-axis, out of principal surfaces 91a and 91b on opposite sides of module board 91. Further, (a) of FIG. 5A illustrates power amplifier 10 disposed on principal surface 91b with the dashed line. On the other hand, (b) of FIG. 5A is a perspective view of the layout of circuit elements when principal surface 91b is viewed from the positive z-axis.

Radio frequency module 1C according to Example 2 shows a specific arrangement of circuit elements included in radio frequency module 1 according to the embodiment.

Radio frequency module 1C according to this example is different from radio frequency module 1A according to Example 1 in the arrangement of power amplifier 10 and switch 40. In the following, description of the common points of radio frequency module 1C according to this example to those of radio frequency module 1A according to Example 1 is omitted, and different points are mainly described.

Module board 91 is a board that includes principal surface 91a (a second principal surface) and principal surface 91b (a first principal surface) on opposite sides of module board 91, and on which the transmission circuit and the reception circuit are mounted. As module board 91, for example, one of an LTCC board, an HTCC board, a component-embedded board, a board that includes an RDL, and a printed circuit board each having a stacked structure of a plurality of dielectric layers is used.

As illustrated in FIGS. 5A and 5B, in radio frequency module 1C according to this example, transmission filter 30T, reception filter 30R, and switch 40 are disposed on principal surface 91a (the second principal surface) of module board 91. On the other hand, power amplifier 10 and low noise amplifier 20 are disposed on principal surface 91b (the first principal surface) of module board 91. Note that switch 40 may be disposed on principal surface 91b.

Transmission filter 30T is an example of a first acoustic wave filter, and reception filter 30R is an example of a second acoustic wave filter. Here, the absolute value of a TCF of transmission filter 30T is smaller than the absolute value of a TCF of reception filter 30R. Specifically, the absolute value of the TCF of the first acoustic wave filter is smaller than the absolute value of the TCF of the second acoustic wave filter.

As illustrated in FIG. 5B, distance $D_{30T}$ between transmission filter 30T and power amplifier 10 is shorter than distance $D_{30R}$ between reception filter 30R and power amplifier 10.

According to the configuration of radio frequency module 1C as described above, reception filter 30R whose TCF has a relatively large absolute value is more spaced apart from power amplifier 10 that generates a great amount of heat than transmission filter 30T whose TCF has a relatively small absolute value. Accordingly, although distance $D_{30T}$ between transmission filter 30T and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1C due to a temperature change can be prevented.

In this example, transmission filter 30T and reception filter 30R are both disposed on principal surface 91a (the second principal surface), yet transmission filter 30T and reception filter 30R may be separately disposed on principal surfaces 91a and 91b.

Even in this case, if distance $D_{30T}$ between transmission filter 30T and power amplifier 10 is shorter than distance $D_{30R}$ between reception filter 30R and power amplifier 10, deterioration of transfer characteristics of radio frequency module 1C due to a temperature change can be prevented.

In radio frequency module 1C according to this example, transmission filter 30T (the first acoustic wave filter) may be a bulk acoustic wave filter, and reception filter 30R (the second acoustic wave filter) may be a LT substrate acoustic wave filter.

In radio frequency module 1C according to this example, transmission filter 30T (the first acoustic wave filter) may be an acoustic-velocity film stacked acoustic wave filter, and reception filter 30R (the second acoustic wave filter) may be one of a bulk acoustic wave filter, a LT substrate acoustic wave filter, and a temperature-compensating LN substrate acoustic wave filter.

In radio frequency module 1C according to this example, transmission filter 30T (the first acoustic wave filter) may be a temperature-compensating LN substrate acoustic wave filter, and reception filter 30R (the second acoustic wave filter) may be a LT substrate acoustic wave filter.

According to such combinations of the first acoustic wave filter and the second acoustic wave filter, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1C due to a temperature change can be prevented.

In radio frequency module 1C according to this example, plural external-connection terminals 150 are disposed on principal surface 91b (the first principal surface) of module board 91. As illustrated in (b) of FIG. 5A, external-connection terminals 150 may be disposed in a perimeter region of principal surface 91b. Some of external-connection terminals 150 are set to the ground potential of a motherboard.

According to the arrangement of external-connection terminals 150 as described above, external-connection terminals 150 used as ground electrodes are disposed around low noise amplifier 20, and thus the inflow of extraneous noise to the reception circuit can be prevented.

In radio frequency module 1C according to this example, external-connection terminals 150 may be disposed on principal surface 91a.

5. Arrangement of Circuit Elements of Radio Frequency Module 1D According to Example 3

Figure 6A:
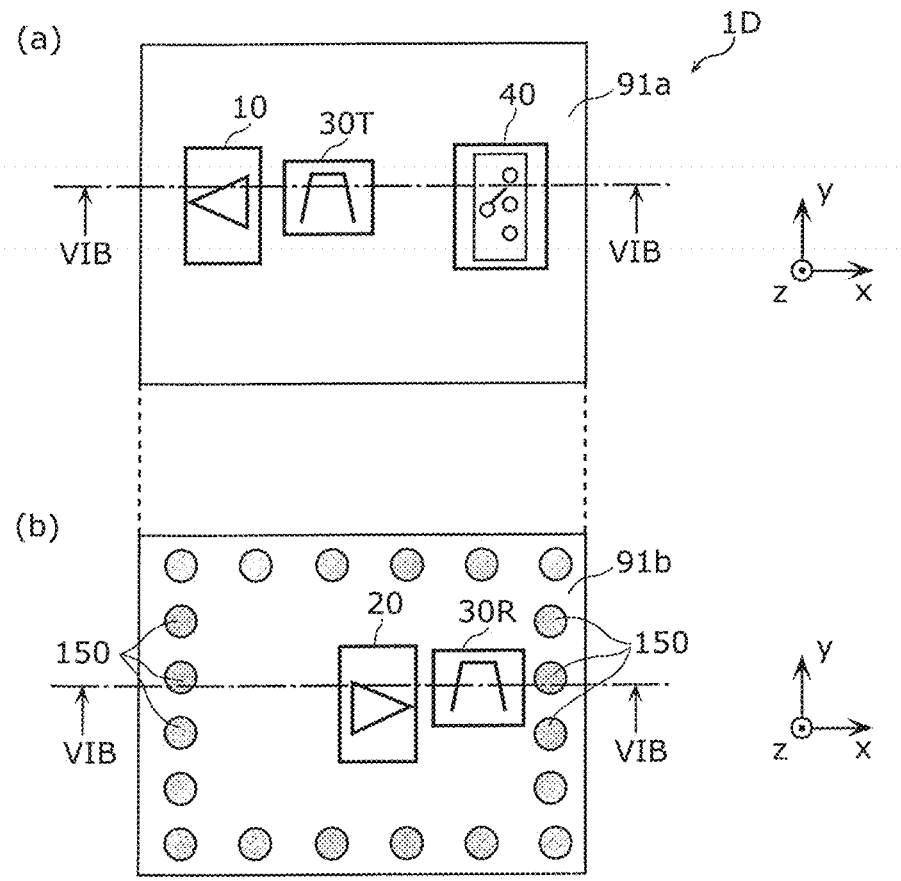
FIG. 6A is a schematic diagram illustrating a planar configuration of a radio frequency module according to Example 3.
Figure 6B:
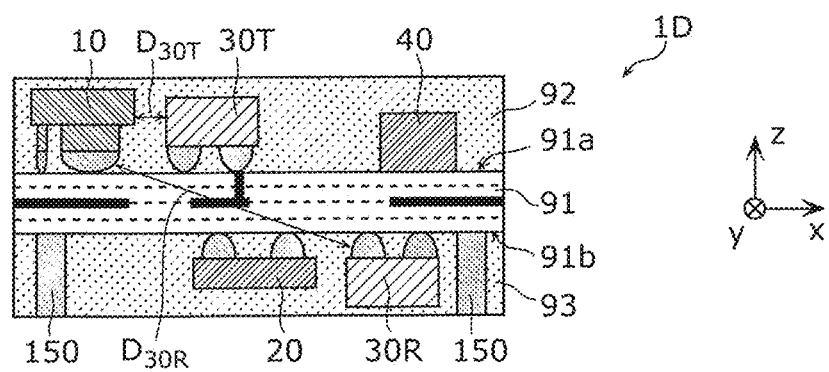
FIG. 6B is a schematic diagram illustrating a cross-sectional configuration of the radio frequency module according to Example 3.

FIG. 6A is a schematic diagram illustrating a planar configuration of radio frequency module 1D according to Example 3. FIG. 6B is a schematic diagram illustrating a cross-sectional configuration of radio frequency module 1D according to Example 3 and specifically, is a cross-sectional view taken along line VIB-VIB in FIG. 6A. Note that (a) of FIG. 6A illustrates a layout of circuit elements when principal surface 91a is viewed from the positive z-axis, out of principal surfaces 91a and 91b on opposite sides of module board 91. On the other hand, (b) of FIG. 6A is a perspective view of the layout of circuit elements when principal surface 91b is viewed from the positive z-axis Radio frequency module 1D according to Example 3 shows a specific arrangement of circuit elements included in radio frequency module 1 according to the embodiment.

Radio frequency module 1D according to this example is different from radio frequency module 1A according to Example 1 in the arrangement of reception filter 30R and switch 40. In the following, description of the common points of radio frequency module 1D according to this example to those of radio frequency module 1A according to Example 1 is omitted, and different points are mainly described.

Module board 91 is a board that includes principal surface 91a (a first principal surface) and principal surface 91b (a second principal surface) on opposite sides of module board 91, and on which the transmission circuit and the reception circuit are mounted. As module board 91, for example, one of an LTCC board, an HTCC board, a component-embedded board, a board that includes an RDL, and a printed circuit board each having a stacked structure of a plurality of dielectric layers is used.

As illustrated in FIGS. 6A and 6B, in radio frequency module 1D according to this example, power amplifier 10, transmission filter 30T, and switch 40 are disposed on principal surface 91a (the first principal surface) of module board 91. On the other hand, low noise amplifier 20 and reception filter 30R are disposed on principal surface 91b (the second principal surface) of module board 91. Note that switch 40 may be disposed on principal surface 91b.

Transmission filter 30T is an example of a first acoustic wave filter, and reception filter 30R is an example of a second acoustic wave filter. Here, the absolute value of a TCF of transmission filter 30T is smaller than the absolute value of a TCF of reception filter 30R. Specifically, the absolute value of the TCF of the first acoustic wave filter is smaller than the absolute value of the TCF of the second acoustic wave filter.

As illustrated in FIG. 6B, distance $D_{30T}$ between transmission filter 30T and power amplifier 10 is shorter than distance $D_{30R}$ between reception filter 30R and power amplifier 10.

According to the configuration of radio frequency module 1D as described above, reception filter 30R whose TCF has a relatively large absolute value is more spaced apart from power amplifier 10 that generates a great amount of heat than transmission filter 30T whose TCF has a relatively small absolute value. Accordingly, although distance $D_{30T}$ between transmission filter 30T and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1D due to a temperature change can be prevented.

In radio frequency module 1D according to this example, transmission filter 30T (the first acoustic wave filter) may be a bulk acoustic wave filter, and reception filter 30R (the second acoustic wave filter) may be a LT substrate acoustic wave filter.

In radio frequency module 1D according to this example, transmission filter 30T (the first acoustic wave filter) may be an acoustic-velocity film stacked acoustic wave filter, and reception filter 30R (the second acoustic wave filter) may be one of a bulk acoustic wave filter, a LT substrate acoustic wave filter, and a temperature-compensating LN substrate acoustic wave filter.

In radio frequency module 1D according to this example, transmission filter 30T (the first acoustic wave filter) may be a temperature-compensating LN substrate acoustic wave filter, and reception filter 30R (the second acoustic wave filter) may be a LT substrate acoustic wave filter.

According to such combinations of the first acoustic wave filter and the second acoustic wave filter, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1D due to a temperature change can be prevented.

In radio frequency module 1D according to this example, plural external-connection terminals 150 are disposed on principal surface 91b (the second principal surface) of module board 91. As illustrated in (b) of FIG. 6A, external-connection terminals 150 may be disposed in a perimeter region of principal surface 91b. Some of external-connection terminals 150 are set to the ground potential of a motherboard.

According to the arrangement of external-connection terminals 150 as described above, external-connection terminals 150 used as ground electrodes are disposed around low noise amplifier 20, and thus the inflow of extraneous noise to the reception circuit can be inhibited.

In radio frequency module 1D according to this example, power amplifier 10 is mounted on principal surface 91a (the first principal surface).

According to this, power amplifier 10 and external-connection terminals 150 can be connected via through electrodes passing through module board 91 from principal surface 91a to principal surface 91b. Accordingly, as a heat dissipation path of power amplifier 10, a heat dissipation path that extends along only a planar line pattern extending in the direction of the xy plane and having high heat resistance can be eliminated from lines in and on module board 91. Accordingly, radio frequency module 1D having improved properties of heat dissipation from power amplifier 10 to the motherboard can be provided.

In this example, power amplifier 10 is disposed on principal surface 91a, and low noise amplifier 20 is disposed on principal surface 91b. According to this, power amplifier 10 and low noise amplifier 20 are disposed with module board 91 therebetween, and thus isolation between transmission and reception can be improved.

In radio frequency module 1D according to this example, external-connection terminals 150 may be disposed on principal surface 91a.

6. Advantageous Effects and Others

As described above, radio frequency module 1A according to Example 1 includes: module board 91 that includes principal surfaces 91a and 91b on opposite sides of module board 91; power amplifier 10 disposed on principal surface 91a; low noise amplifier 20 disposed on principal surface 91b; transmission filter 30T (a first acoustic wave filter) disposed on a surface that is one of principal surfaces 91a and 91b; and reception filter 30R (a second acoustic wave filter) disposed on a surface that is one of principal surfaces 91a and 91b. An absolute value of a TCF of transmission filter 30T is smaller than an absolute value of a TCF of reception filter 30R, and distance $D_{30T}$ between transmission filter 30T and power amplifier 10 is shorter than distance $D_{30R}$ between reception filter 30R and power amplifier 10.

According to this, reception filter 30R (the second acoustic wave filter) whose TCF has a relatively large absolute value is more spaced apart from power amplifier 10 that generates a great amount of heat than transmission filter 30T (the first acoustic wave filter) whose TCF has a relatively small absolute value. Accordingly, although distance $D_{30T}$ between transmission filter 30T and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1A due to a temperature change can be prevented.

Radio frequency module 1A may further include external-connection terminal 150 disposed on principal surface 91b.

Accordingly, external-connection terminals 150 used as ground electrodes can be disposed around low noise amplifier 20, and thus the inflow of extraneous noise to the reception circuit can be prevented.

Transmission filter 30T (the first acoustic wave filter) may be disposed on principal surface 91a, and reception filter 30R (the second acoustic wave filter) may be disposed on principal surface 91a.

The surface on which transmission filter 30T (the first acoustic wave filter) is disposed may be different from the surface on which reception filter 30R (the second acoustic wave filter) is disposed.

Transmission filter 30T (the first acoustic wave filter) may be disposed on principal surface 91b, reception filter 30R (the second acoustic wave filter) may be disposed on principal surface 91a, and transmission filter 30T (the first acoustic wave filter) may be an acoustic-velocity film stacked acoustic wave filter.

According to this, low noise amplifier 20 and the acoustic-velocity film stacked acoustic wave filter each having height readily decreased are disposed on principal surface 91b facing a motherboard, and thus the height of radio frequency module 1A as a whole can be decreased.

Radio frequency module 1C according to Example 2 includes: module board 91 that includes principal surfaces 91a and 91b on opposite sides of module board 91; power amplifier 10 disposed on principal surface 91b; low noise amplifier 20 disposed on principal surface 91b; transmission filter 30T (a first acoustic wave filter) disposed on principal surface 91a; and reception filter 30R (a second acoustic wave filter) disposed on principal surface 91a. An absolute value of a TCF of transmission filter 30T is smaller than an absolute value of a TCF of reception filter 30R, and distance $D_{30T}$ between transmission filter 30T and power amplifier 10 is shorter than distance $D_{30R}$ between reception filter 30R and power amplifier 10.

According to this, reception filter 30R (the second acoustic wave filter) whose TCF has a relatively large absolute value is more spaced apart from power amplifier 10 that generates a great amount of heat than transmission filter 30T (the first acoustic wave filter) whose TCF has a relatively small absolute value. Accordingly, although distance $D_{30T}$ between transmission filter 30T and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1C due to a temperature change can be prevented.

Radio frequency module 1C may further include external-connection terminal 150 disposed on principal surface 91b.

Accordingly, external-connection terminals 150 used as ground electrodes can be disposed around low noise amplifier 20, and thus the inflow of extraneous noise to the reception circuit can be prevented.

Radio frequency module 1 according to the present embodiment may further include antenna connection terminal 100, transmission filter 30T (the first acoustic wave filter) may be a transmission filter disposed on transmission path AT that connects power amplifier 10 and antenna connection terminal 100, and configured to pass a transmission signal amplified by power amplifier 10, and reception filter 30R (the second acoustic wave filter) may be a reception filter disposed on reception path AR that connects antenna connection terminal 100 and low noise amplifier 20, and configured to pass a reception signal.

A high-power transmission signal amplified by power amplifier 10 is input to transmission filter 30T, and thus the temperature of transmission filter 30T readily increases. Accordingly, the absolute value of the TCF of transmission filter 30T is desirably small. Accordingly, deterioration of transfer characteristics of radio frequency module 1 due to a temperature change can be still further prevented.

In radio frequency module 1, transmission filter 30T (the first acoustic wave filter) may be a bulk acoustic wave filter, and reception filter 30R (the second acoustic wave filter) may be a LT substrate acoustic wave filter.

In radio frequency module 1, transmission filter 30T (the first acoustic wave filter) may be an acoustic-velocity film stacked acoustic wave filter, and reception filter 30R (the second acoustic wave filter) may be one of a bulk acoustic wave filter, a LT substrate acoustic wave filter, and a temperature compensating LN substrate acoustic wave filter.

In radio frequency module 1, transmission filter 30T (the first acoustic wave filter) may be a temperature compensating LN substrate acoustic wave filter, and reception filter 30R (the second acoustic wave filter) may be a LT substrate acoustic wave filter.

According to this, although distance $D_{30T}$ between transmission filter 30T (the first acoustic wave filter) and power amplifier 10 is short, transmission filter 30T has a TCF whose absolute value is relatively small, and thus can reduce a change in passing characteristics even if transmission filter 30T is subjected to a great temperature change caused by power amplifier 10. On the other hand, although reception filter 30R (the second acoustic wave filter) has a TCF whose absolute value is relatively large, distance $D_{30R}$ between reception filter 30R and power amplifier 10 is great, and thus reception filter 30R is subjected to a small temperature change caused by power amplifier 10 so that reception filter 30R can reduce a change in passing characteristics. Accordingly, deterioration of transfer characteristics of radio frequency module 1 due to a temperature change can be prevented.

Radio frequency module 1A according to Example 1 includes: module board 91 that includes principal surfaces 91a and 91b on opposite sides of module board 91; power amplifier 10 disposed on principal surface 91a; low noise amplifier 20 disposed on principal surface 91b; transmission filter 30T (a first acoustic wave filter) disposed on a surface that is one of principal surfaces 91a and 91b; and reception filter 30R (a second acoustic wave filter) disposed a surface that is one of principal surfaces 91a and 91b. Transmission filter 30T is a bulk acoustic wave filter, reception filter 30R is a LT substrate acoustic wave filter, and distance $D_{30T}$ between transmission filter 30T and power amplifier 10 is shorter than distance $D_{30R}$ between reception filter 30R and power amplifier 10.

According to this, the LT substrate acoustic wave filter whose TCF has a relatively large absolute value is more spaced apart from power amplifier 10 that generates a great amount of heat than a bulk acoustic wave filter whose TCF has a relatively small absolute value. Accordingly, deterioration of transfer characteristics of radio frequency module 1A due to a temperature change can be prevented.

Radio frequency module 1A according to Example 1 includes: module board 91 that includes principal surfaces 91a and 91b on opposite sides of module board 91; power amplifier 10 disposed on principal surface 91a; low noise amplifier 20 disposed on principal surface 91b; transmission filter 30T (a first acoustic wave filter) disposed on a surface that is one of principal surfaces 91a and 91b; and reception filter 30R (a second acoustic wave filter) disposed on a surface that is one of principal surfaces 91a and 91b. Transmission filter 30T is an acoustic-velocity film stacked acoustic wave filter, reception filter 30R is one of a bulk acoustic wave filter, a LT substrate acoustic wave filter, and a temperature compensating LN substrate acoustic wave filter, and distance $D_{30T}$ between transmission filter 30T and power amplifier 10 is shorter than distance $D_{30R}$ between reception filter 30R and power amplifier 10.

According to this, the one of the bulk acoustic wave filter, the LT substrate acoustic wave filter, and the temperature-compensating LN substrate acoustic wave filter whose TCFs each have a relatively large absolute value is more spaced apart from power amplifier 10 that generates a great amount of heat than the acoustic-velocity film stacked acoustic wave filter whose TCF has a relatively small absolute value. Accordingly, deterioration of transfer characteristics of radio frequency module 1A due to a temperature change can be prevented.

Communication device 5 includes: RFIC 3 configured to process radio frequency signals transmitted and received by antenna 2; and radio frequency module 1 configured to transfer the radio frequency signals between antenna 2 and RFIC 3.

Accordingly, communication device 5 can be provided in which deterioration of signal-transfer characteristics caused by a temperature change is reduced.

Other Embodiments Etc.

The above has described the radio frequency module and the communication device according to the embodiment of the present disclosure, using an embodiment, examples, and variations thereof, yet the radio frequency module and the communication device according to the present disclosure are not limited to the embodiment, the examples, and the variations thereof. The present disclosure also encompasses another embodiment achieved by combining arbitrary elements in the embodiment, the examples, and the variations thereof, variations as a result of applying various modifications that may be conceived by those skilled in the art to the embodiment, the examples, and the variations thereof without departing from the scope of the present disclosure, and various apparatuses that include the radio frequency module and the communication device according to the present disclosure.

For example, in the radio frequency modules and the communication devices according to the embodiment, the examples, and the variations thereof, another circuit element and another line, for instance, may be disposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion that supports multiband technology.

The invention claimed is:

1. A radio frequency module, comprising:
a module board that includes a first principal surface and a second principal surface on opposite sides of the module board;
a power amplifier disposed on the first principal surface;
a low noise amplifier disposed on the second principal surface;
a first acoustic wave filter disposed on one of the first principal surface and the second principal surface; and
a second acoustic wave filter disposed on one of the first principal surface and the second principal surface,
wherein an absolute value of a temperature coefficient of frequency of the first acoustic wave filter is smaller than an absolute value of a temperature coefficient of frequency of the second acoustic wave filter, and
a distance between the first acoustic wave filter and the power amplifier is shorter than a distance between the second acoustic wave filter and the power amplifier.

2. The radio frequency module according to claim 1, further comprising:
an external-connection terminal disposed on the second principal surface.

3. The radio frequency module according to claim 1, wherein the first acoustic wave filter is disposed on the first principal surface, and
the second acoustic wave filter is disposed on the first principal surface.

4. The radio frequency module according to claim 1, wherein a surface of the module board on which the first acoustic wave filter is disposed is different from that on which the second acoustic wave filter is disposed.

5. The radio frequency module according to claim 4, wherein the first acoustic wave filter is disposed on the second principal surface,
the second acoustic wave filter is disposed on the first principal surface, and
the first acoustic wave filter is an acoustic-velocity film stacked acoustic wave filter having a structure in which a plurality of layers having different bulk wave acoustic velocities or a plurality of layers having different acoustic impedances are stacked.

6. The radio frequency module according to claim 1, wherein
the power amplifier is disposed on the first principal surface, and
the low noise amplifier is disposed on the first principal surface.

7. The radio frequency module according to claim 6, further comprising:
an external-connection terminal disposed on the first principal surface.

8. The radio frequency module of claim 1, wherein
the power amplifier is disposed on the first principal surface, and
the low noise amplifier is disposed on the second principal surface.

9. The radio frequency module according to claim 1, further comprising:
an antenna connection terminal,
wherein the first acoustic wave filter is a transmission filter disposed on a transmission path that connects the power amplifier and the antenna connection terminal, and configured to pass a transmission signal amplified by the power amplifier, and
the second acoustic wave filter is a reception filter disposed on a reception path that connects the antenna connection terminal and the low noise amplifier, and configured to pass a reception signal.

10. The radio frequency module according to claim 1, wherein the first acoustic wave filter operates with a bulk acoustic wave, and
the second acoustic wave filter operates with a surface acoustic wave that propagates through a piezoelectric substrate made of LiTaO3.

11. The radio frequency module according to claim 1, wherein the first acoustic wave filter is an acoustic-velocity film stacked acoustic wave filter having a structure in which a plurality of layers having different bulk wave acoustic velocities or a plurality of layers having different acoustic impedances are stacked, and
the second acoustic wave filter is one of:
a filter that operates with a bulk acoustic wave;
a filter that operates with a surface acoustic wave that propagates through a piezoelectric substrate made of LiTaO3; and
a filter that operates with a surface acoustic wave that propagates through a piezoelectric substrate which is made of LiNbO3 and above which an insulating layer that adjusts a frequency-temperature characteristic is disposed.

12. The radio frequency module according to claim 1, wherein the first acoustic wave filter operates with a surface acoustic wave that propagates through a piezoelectric substrate which is made of LiNbO3 and above which an insulating layer that adjusts a frequency-temperature characteristic is disposed, and
the second acoustic wave filter operates with a surface acoustic wave that propagates through a piezoelectric substrate made of LiTaO3.

13. The radio frequency module according to claim 8, wherein:
the first acoustic wave filter operates with a bulk acoustic wave, and
the second acoustic wave filter operates with a surface acoustic wave that propagates through a piezoelectric substrate made of LiTaO3.

14. The radio frequency module according to claim 8, wherein:
the first acoustic wave filter is an acoustic-velocity film stacked acoustic wave filter having a structure in which a plurality of layers having different bulk wave acoustic velocities or a plurality of layers having different acoustic impedances are stacked,
the second acoustic wave filter is one of:

a filter that operates with a bulk acoustic wave;
a filter that operates with a surface acoustic wave that propagates through a piezoelectric substrate made of LiTaO3; and
a filter that operates with a surface acoustic wave that propagates through a piezoelectric substrate which is made of LiNbO3 and above which an insulating layer for adjusting a frequency-temperature characteristic is disposed.

15. The radio frequency module according to claim 13, further comprising:
external-connection terminal disposed on the second principal surface.

16. A communication device, comprising:
a radio frequency (RF) signal processing circuit configured to process radio frequency signals transmitted and received by an antenna; and
a radio frequency module configured to transfer the radio frequency signals between the antenna and the RF signal processing circuit, the radio frequency module, comprising
a module board that includes a first principal surface and a second principal surface on opposite sides of the module board,
a power amplifier disposed on the module board,
a low noise amplifier disposed on the module board,
a first acoustic wave filter disposed on one of the first principal surface and the second principal surface, and
a second acoustic wave filter disposed on one of the first principal surface and the second principal surface,
wherein an absolute value of a temperature coefficient of frequency of the first acoustic wave filter is smaller than an absolute value of a temperature coefficient of frequency of the second acoustic wave filter, and
a distance between the first acoustic wave filter and the power amplifier is shorter than a distance between the second acoustic wave filter and the power amplifier,
wherein a surface of the module board on which the first acoustic wave filter is disposed is different from that on which the second acoustic wave filter is disposed.

17. The communication device according to claim 16, wherein the radio frequency module, further comprising:
an external-connection terminal disposed on the second principal surface.

18. The communication device according to claim 16, wherein the first acoustic wave filter is disposed on the first principal surface, and
the second acoustic wave filter is disposed on the first principal surface.

19. The communication device according to claim 16, wherein the first acoustic wave filter is disposed on the second principal surface,
the second acoustic wave filter is disposed on the first principal surface, and
the first acoustic wave filter is an acoustic-velocity film stacked acoustic wave filter having a structure in which a plurality of layers having different bulk wave acoustic velocities or a plurality of layers having different acoustic impedances are stacked.

* * * * *